United States Patent [19]

Rapp

[11] 3,823,330

[45] July 9, 1974

[54] CIRCUIT FOR SHIFTING AND AMPLIFYING INPUT VOLTAGES

[75] Inventor: A. Karl Rapp, Beverly, N.J.

[73] Assignee: Inselek Inc., Princeton, N.J.

[22] Filed: Jan. 18, 1973

[21] Appl. No.: 324,580

[52] U.S. Cl. ............. 307/214, 307/205, 307/260 A, 330/13, 330/35

[51] Int. Cl. ............................................ H03k 19/40

[58] Field of Search ........ 330/13, 35; 307/205, 214, 307/304, 260 A

[56] References Cited

UNITED STATES PATENTS

| | | | |
|---|---|---|---|
| 3,337,862 | 8/1967 | Croft et al. | 330/13 X |
| 3,375,455 | 3/1968 | Motta | 330/13 |
| 3,500,218 | 3/1970 | Burwen | 330/13 X |
| 3,728,556 | 4/1973 | Arnel | 307/304 X |

OTHER PUBLICATIONS

Axelrod, "Speed-Up Circuit for NOR Circuits Using Insulated-Gate, Field-Effect Transistors," IBM Technical Disclosure Bulletin, July, 1964, pp. 168, 169.

*Primary Examiner*—Herman Karl Saalbach
*Assistant Examiner*—James B. Mullins
*Attorney, Agent, or Firm*—Amster & Rothstein

[57] ABSTRACT

A circuit for shifting and amplifying input voltages includes a p-channel enhancement-type FET and an n-channel deep-depletion type FET which are adapted to be alternatingly rendered conductive and nonconductive. A first source of reference potential is connected to the n-channel deep-depletion type FET and a second source of reference potential is connected to the p-channel enhancement-type FET, which sources of reference potential are adapted to be coupled to an output terminal when their respective FETs are rendered conductive. A breakdown voltage device and a second n-channel deep-depletion type FET are provided, according to one embodiment of the invention, and are arranged such that the second FET acts as a current source to break down the breakdown device. The breakdown device thereby properly translates the input voltage, applied at the input of the circuit, to appropriate levels to control the p-channel enhancement-type FET and the first n-channel deep-depletion type FET. According to another embodiment of the invention, another p-channel enhancement-type FET is provided in order to pull up the input voltage.

18 Claims, 2 Drawing Figures

CIRCUIT FOR SHIFTING AND AMPLIFYING INPUT VOLTAGES

Figure 1:
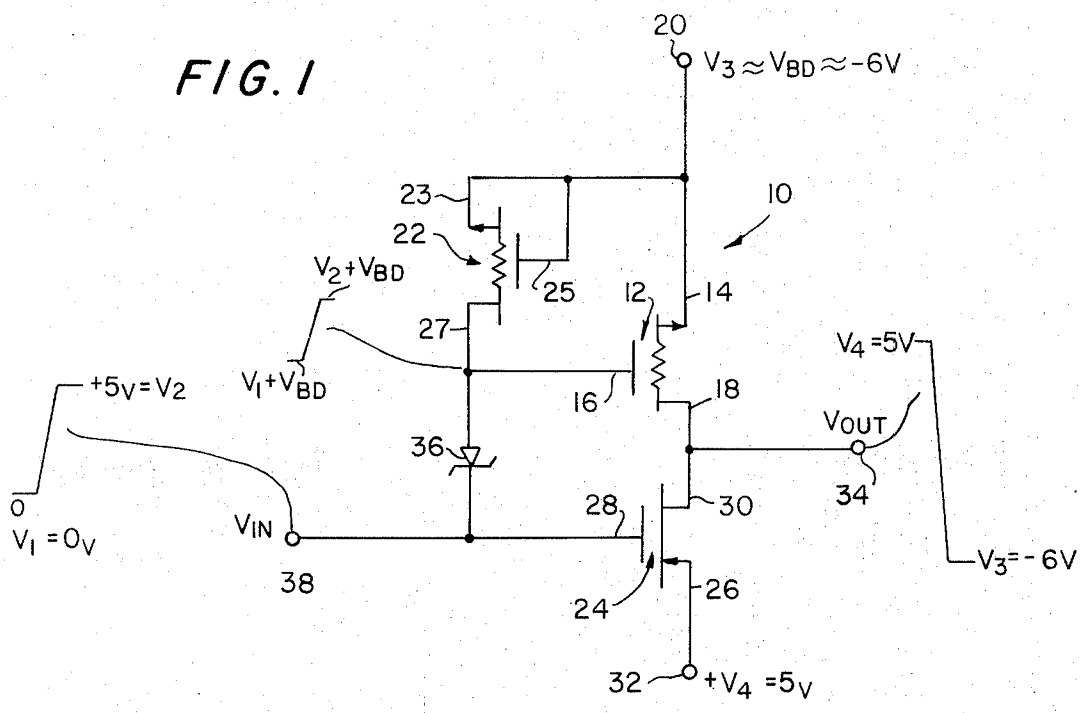

This invention relates generally to circuits for shifting and amplifying input voltages and, more particularly to a circuit for shifting and amplifying the logic "1" and the logic "0" levels of bipolar circuits to logic "1" and logic "0" levels suitable for MOS and SOS MOS circuits.

By way of background, semiconductor circuit elements, such as FETs, diodes, transistors, etc., have been fabricated by using either MOS or bipolar circuit techniques. As a rule, circuits fabricated with MOS circuit elements are generally inexpensive to manufacture but these circuits are relatively slow in operation. On the other hand, circuits fabricated with bipolar circuit elements are faster in operation but are more costly to manufacture. Although MOS and bipolar manufacturers have attempted to resolve the disadvantages resulting from the use of MOS or bipolar circuit elements, the former by attempting to develop dynamic circuits which operate faster, while the latter attempting to provide greater circuit density and lower cost by increasing the sophistication of processing techniques, neither have been wholly successful.

In an attempt to incorporate the inexpensiveness of MOS circuit elements with the fastness of bipolar circuit elements, silicon-on-sapphire (SOS) MOS circuit elements have recently been produced. The starting material for SOS MOS circuit elements is a substrate of single-crystal sapphire, upon which a film of single-crystal silicon is epitaxially grown. The film is typically one micrometer thick and has a 1-0-0 orientation. By utilizing SOS MOS circuit elements, circuits can be fabricated which have bipolar speeds yet are comparable, in cost, with circuits using MOS circuit elements.

The quickness of SOS MOS circuit elements is due, to a large degree, to the presence of good isolating sapphire. As a result thereof, both p- and n-channel SOS MOS circuit elements can be formed in a single layer of highly resistivity silicon. A level of interconnects is available in SOS MOS circuit elements that is free of the parasitic capacitance which exists between the active diffusions and substrate of bulk-silicon devices. Since there is no silicon between devices, there is no possibility of field inversion leakage in SOS MOS circuit elements. In addition, since diffusions expand through the film to its interface with the sapphire, there is virtually no junction capacitance in the SOS MOS circuit elements and, since junction capacitance is one of the major factors limiting speed of conventional MOS devices, SOS MOS circuit elements can be fabricated which are significantly faster than conventional MOS devices.

As to advantages over bipolar devices, one significant advantage of SOS MOS circuit elements is that these circuit elements are fabricated by proven MOS techniques and well-known silicon processes. As a result, SOS MOS circuit elements can be fabricated relatively easily with such fabrication being controlled with high efficiency. A more specific description of the actual techniques utilized to fabricate SOS MOS devices may be found in application Ser. No. 324,387, filed on Jan. 17, 1973, in the name of Edward C. Ross and Joseph Burns, and assigned to the assignee of the present invention.

Specific SOS MOS circuit elements may include diodes, transistors, FETs, etc. The FET type SOS MOS circuit elements may be enhancement-type FETs or deep-depletion type FETs. An enhancement-type FET usually includes a region of doped silicon which is bounded, on either side, by regions of highly-doped silicon, which highly-doped regions are of a different "type." In other words, a p-channel enhancement-type FET would include a region of n-doped silicon bounded by regions of p+ doped silicon. A deep-depletion type FET, on the other hand, generally includes a region of doped-silicon bounded, on either side, by highly-doped regions of silicon of the same "type." In other words, an n-type deep-depletion FET would include a region of n-doped silicon bounded by regions of n+ doped silicon.

Although the general circuit characteristics and operation of enhancement-type and deep-depletion type FETs are generally the same, the two types of circuit elements differ in one major respect. In an enhancement-type FET, the gate to source voltage must reach a particular threshold value before drain current flows. A deep-depletion type FET, on the other hand, has a residual drain current, that is, drain current flows notwithstanding the fact that the gate to source voltage is zero. It has been found advantageous to fabricate circuits utilizing complementary enhancement-type and deep-depletion type FETs. This is due to the fact that complementary enhancement-type and deep-depletion type FETs, (for example, a p-channel enhancement-type FET and an n-channel deep-depletion type FET) can be fabricated relatively easily on a single substrate.

Often, it is necessary to utilize bipolar circuits in combination with MOS circuits or in combination with SOS MOS circuits. One specific difficulty, however, has been the fact that often the voltage levels generated by bipolar circuits, such as $T^2L$ bipolar circuits, are not compatible with the necessary voltages suitable for MOS or SOS MOS circuits. Specifically, the logic "1" voltage generated in $T^2L$ bipolar circuits is usually 3.2 volts while the logic "0" level generated by the circuit is approximately 0 volts. On the other hand, the logic "1" level for MOS or SOS MOS circuits is approximately 5 volts while the corresponding "0" logic level is, typically, −5 to −10 volts. Thus, there exists a need in the art to provide a circuit for shifting and amplifying input voltages applied thereto, which input voltages may correspond to $T^2L$ bipolar voltage logic levels, to corresponding voltage levels compatible with MOS or SOS MOS circuits. Of course, such a circuit must operate quickly in order to be compatible with the fast acting bipolar circuits.

Accordingly, a broad object of the present invention is to provide an improved circuit for shifting and amplifying input voltages.

A more specific object of this invention is to provide a circuit for shifting and amplifying logic levels of bipolar circuits to logic levels utilizable with MOS and SOS MOS circuits.

Another object of this invention is to provide a circuit for shifting and amplifying input voltages, which circuit operates quickly and may be fabricated relatively easily.

Yet another object of this invention is to provide a circuit for shifting and amplifying input voltage which may be fabricated by utilizing SOS MOS circuit elements.

In accordance with a first illustrative embodiment demonstrating objects and features of the present invention, there is provided a circuit for shifting and amplifying input voltages, advantageously fabricated from SOS MOS circuit elements, which circuit includes a first p-channel enhancement-type FET having source, gate and drain terminals and a first n-channel deep-depletion type FET having source, gate and drain terminals. A second n-channel deep-depletion type FET, having source, gate and drain terminals, is connected between the gate and source terminals of the first n-channel FET. The second n-channel FET acts as a current source for a breakdown device which is connected between the gate terminals of the first p-channel and n-channel FETs. A circuit terminal is provided for coupling a first source of reference potential, advantageously equal to the breakdown voltage of the breakdown device, to the first n-channel FET and another circuit terminal is provided for coupling a second source of reference potential to the first p-channel FET. The circuit operates such that an input voltage of a first predetermined level applied to the input terminal of the circuit causes the first p-channel FET to be rendered conductive and the first n-channel FET to be rendered nonconductive thereby applying the second source of reference potential to the output of the circuit. On the other hand, when the input voltage goes to a voltage of a second predetermined level, the first p-channel FET is rendered nonconductive and the first n-channel FET is rendered conductive thereby applying the first source of reference potential to the output of the circuit. The breakdown device provides proper translation of the input voltage in order to control the first n-channel FET.

In accordance with a second illustrative embodiment demonstrating objects and features of the present invention, the circuit is modified to include a second p-channel enhancement-type FET which is connected between the input terminal to the circuit and the source terminal of the first p-channel FET. The second p-channel FET functions as a "pull up" device in order to increase the input voltage applied to the circuit. Additionally, the second n-channel deep-depletion type FET is connected so as to permit rapid discharging of the gate capacitance of the first n-channel FET in order to provide quicker operation of the circuit.

Figure 2:
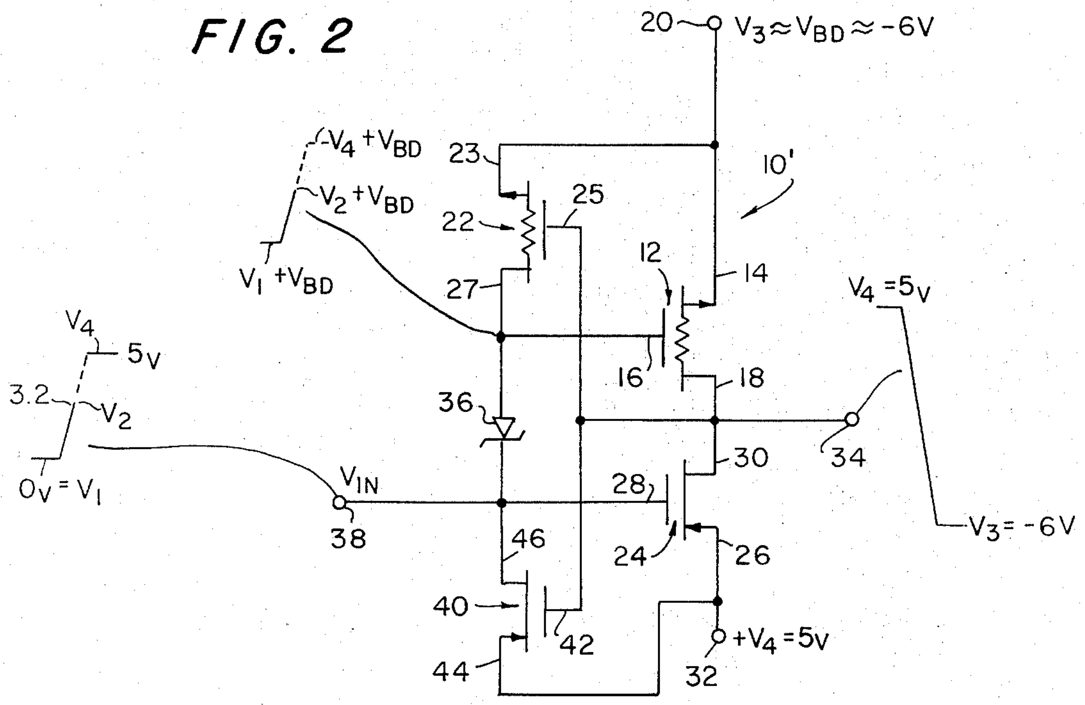

The above brief description as well as further objects, features and advantages of the present invention will be more fully appreciated by reference to the following detailed description of two preferred, but nonetheless illustrative embodiments, when taken in conjunction with the accompanying drawings, wherein:

FIG. 1 is a circuit schematic view of a circuit for shifting and amplifying input voltages according to one embodiment of the present invention; and FIG. 2 is a circuit schematic view of a circuit for shifting and amplifying input voltages, such as input voltages provided from bipolar logic levels, to levels useful in MOS and SOS MOS circuits, according to a second embodiment of the present invention.

Referring now to the drawings and, in particular, to FIG. 1 thereof, a circuit for shifting and amplifying input voltages according to a first embodiment of the invention is generally designated 10. Shifting and amplifying circuit 10 includes a first n-channel deep-depletion type FET 12 having respective source, gate and drain terminals 14, 16 and 18. The source terminal 14 of n-channel FET 12 is connected to a terminal 20, which terminal is adapted to be connected to a first source of reference potential, $V_3$ which, as will be explained hereinafter, is chosen to be equal to approximately −6 volts corresponding to a "0" logic level used in MOs and SOS MOS circuits.

A second n-channel deep-depletion type FET 22 is connected between the source terminal 14 and the gate terminal 16 of first n-channel FET 12. FET 22 is utilized as a current source and acts to break down a breakdown device utilized in shifting and amplifying circuit 10, as will be explained hereinafter. Second n-channel FET 22 includes respective source, gate and drain terminals 23, 25 and 27 and is arranged in circuit 10 such that the source and gate terminals 23, 25 of this FET are connected together. Specifically, both the source and gate terminals of FET 22 are connected to source 14 of FET 12 while drain terminal 27 is connected to the gate 16 of FET 12.

Shifting and amplifying circuit 10 includes a first p-channel enhancement-type FET 24 having respective source, gate and drain terminals 26, 28 and 30. The source terminal 26 of FET 24 is coupled to a terminal 32, which terminal is adapted to be connected to a second source of reference potential, $V_4$. The second source of reference potential, $V_4$, is advantageously chosen to equal approximately 5 volts, which voltage corresponds to a logic "1" level suitable for use in MOS and SOS MOS circuits.

The drain terminal 30 of FET 24 is connected to the drain terminal 18 of FET 12; and both these terminals are connected to an output terminal 34 which provides an output voltage, $V_{out}$, which, as will be explained hereinafter, varies between a voltage equal to the first source of reference potential $V_3$ and a voltage equal to the second source of reference potential $V_4$. The output voltage at terminal 34 may thereby be utilized as appropriate logic levels in MOS and SOS MOS circuits.

Connected between the gate terminal 28 of FET 24 and the juncture of drain terminal 27 of FET 22 and gate terminal 16 of FET 12 is a breakdown device, such as a Zener diode, 36. Zener diode 36 is chosen to have a predetermined breakdown voltage, $V_{BD}$, which breakdown voltage is advantageously chosen to correspond to $V_3$, the first source of reference potential applied to terminal 20. Thus, Zener diode 36 advantageously exhibits a breakdown at −6 volts. As will be explained hereinafter, second n-channel deep-depletion type FET 22 is utilized as a current source for Zener diode 36 thereby keeping Zener 36 at its breakdown voltage which, in turn, translates the input voltage to appropriate levels to control first n-channel FET 12.

Specifically, shifting and amplifying circuit 10 includes an input terminal 38 adapted to receive an input voltage $V_{IN}$. Input voltage $V_{IN}$ varies between a first predetermined voltage, $V_1$, and a second predetermined voltage, $V_2$. By way of example, $V_1$ may equal 0 volts and $V_2$ may equal 5 volts.

In operation, shifting and amplifying circuit 10 is utilized to amplify, translate, and invert the input voltages applied at terminal 38 to output voltages available at output terminal 34, wherein the output voltage may be advantageously utilized in MOS and SOS MOS circuits. Specifically, when voltage of a first predetermined magnitude is applied to input terminal 38, that is, when $V_{IN} = V_1 = 0$ volts, p-channel enhancement-type FET 24 is rendered conductive or "on" and the second source of reference potential, that is, $V_4 = 5$ volts, is coupled to output terminal 34 so that $V_{out} = V_4 = 5$ volts. On the other hand, when voltage of a second predetermined magnitude is applied to input terminal 38, that is, with $V_{IN} = V_2 = 5$ volts, first n-channel deep-depletion type FET is rendered conductive or "on" and the first source of reference potential, that is $V_3 = -6$ volts, is coupled to terminal 34 so that $V_{out} = V_3 = -6$ volts.

More particularly, with $V_{IN} = V_1 = 0$ volts, the gate to source voltage of p-channel enhancement-type FET 24 is equal to $V_{IN} - V_4 = - V_4 = - 5$ volts. Since the threshold voltage of a p-channel enhancement-type FET may be typically −2 volts, FET 24 is rendered conductive or "on." Considering n-channel deep-depletion type FET 22, since the source terminal 23 and the gate terminal 25 of FET 22 are connected together, the gate to source voltage of this FET is always held to zero volts. Thus, FET 22 is rendered nonconductive or "off." However, as explained hereinbefore, at a gate to source voltage of zero volts, a residual drain current (typically 10 micro amperes) flows through FET 22 since this FET is a deep-depletion device. This small residual drain current produced by n-channel deep-depletion type FET 22 is sufficient to break down Zener diode 36. Consequently (and as indicated in FIG. 1), the voltage at the gate terminal 16 of first n-channel deep-depletion type FET 12 goes to the input voltage plus the voltage across Zener diode 36, that is, the gate voltage is equal to $V_1 + V_{BD} = 0 + (-6)$ volts $= - 6$ volts. Since $V_3$, the first source of reference potential which is applied to the source terminal of FET 12 is chosen to equal the breakdown voltage of diode 36, that is, the voltage at the source terminal of FET 22 is −6 volts, this results in a gate to source voltage for FET 12 of zero volts. Accordingly, FET 12 is rendered nonconductive or "off." Thus, with $V_{IN} = V_1 = 0$ volts, p-channel enhancement-type FET 24 is rendered conductive or "on" and first n-channel deep-depletion type FET 12 is rendered nonconductive or " off." Therefore, the second source of reference potential, $V_4 = 5$ volts, is coupled to output terminal 34 so that $V_{out} = V_4 = 5$ volts.

Considering next the operation of circuit 10 when $V_{IN}$ equals the second predetermined voltage, that is, when $V_{IN} = V_2 = 5$ volts, the gate to source voltage of p-channel enhancement-type FET 24 is reduced to zero volts. Consequently, this FET is rendered nonconductive or turned "off." FET 22, on the other hand, remains "off" since the gate and source terminals of this FET are tied together. Thus, Zener diode 36 remains at its breakdown voltage, due to the residual drain current provided by deep-depletion type FET 22. The voltage at gate 16 of n-channel FET 12 goes to the input voltage, $V_{IN}$, plus the breakdown voltage, $V_{BD}$, across the Zener diode. Thus, the voltage at gate terminal 16 rises to $V_{IN} + V_{BD} = V_2 + V_{BD} = 5$ volts $-6$ volts $= - 1$ volt from its previous level of −6 volts. Accordingly, the gate to source voltage of n-channel FET 12 increases to 5 volts (−1 volt at gate 16 minus the −6 voltage at source 14 provided by $V_3$). Consequently, FET 14 is rendered conductive or "on" and the first source of reference potential, $V_3$, is coupled to output terminal 34.

In summary, with $V_{IN}$ equal to the first predetermined voltage ($V_1 = 0$ volts), first n-channel deep-depletion type FET 12 is rendered nonconductive or "off," p-channel enhancement-type FET 24 is rendered conductive or "on" and the second source of reference potential ($V_4 = 5$ volts) is connected to the output 34 of the circuit. On the other hand, with $V_{IN}$ equal to the second predetermined voltage ($V_2 = 5$ volts), FET 24 is rendered nonconductive or "off," FET 12 is rendered conductive or "on" and the first source of reference potential ($V_3 = -6$ volts) is connected to output terminal 34. It will be appreciated that proper operation of circuit 10 is provided, in part, by the fact that Zener diode 36 is maintained at breakdown by the residual drain current provided by second n-channel deep-depletion type FET 22, the latter maintained in its "off" or nonconductive state. Thus, Zener diode 36 translates the input voltage to appropriate levels to control FET 12. In other words, Zener diode 36 acts as a source of voltage, controlled by FET 22, which voltage is added to the input voltage at 38 to provide an appropriate voltage at gate 16 to control the conduction of FET 12. If $V_3$ and $V_4$, the first and second reference potentials are chosen to be equal to 5 and −6 volts, respectively, it will be appreciated that circuit 10 provides output voltages which may be utilized in MOS and SOS MOS circuits.

Although the shifting and amplifying circuit 10 of FIG. 1 operates in a sufficient manner for most applications, improved operation is provided by the circuit of FIG. 2. Specifically, in the circuit of FIG. 1 during the transition from $V_{IN} = V_2$ to $V_{IN} = V_1$, although p-channel FET 24 is turned "on" immediately, n-channel FET 12 is not immediately turned "off." This is due to the gate capacitance (not shown) of FET 12 which must discharge in order for this FET to be turned "off." The only discharge path for the gate capacitance is via n-channel deep-depletion type FET 22. However, since FET 22 is maintained in its nonconductive or "off" mode, the current flow through this FET is limited to its residual current and, accordingly, n-channel FET 12 is turned off at a rate which may be too "slow" for some applications. This is especially true when circuit 10 is receiving an input voltage from a bipolar circuit, which bipolar circuit operates "quickly."

Referring now to FIG. 2, a shifting and amplifying circuit according to a second embodiment of the present invention is designated 10′. This circuit includes many of the circuit components utilized in the circuit according to the first embodiment and, accordingly, corresponding circuit elements have been designated by the same reference numerals. Thus, shifting and amplifying circuit 10′ includes a first p-channel enhancement-type FET 24, a first n-channel deep-depletion type FET 12, a second n-channel deep-depletion type FET 22 and a breakdown device, such as a Zener diode 36. As with circuit 10, circuit 10′ includes a first source of reference potential, $V_3 = -6$ volts, which is chosen to be approximately equal to the breakdown voltage $V_{BD}$ of Zener diode 36, and is adapted to be coupled to output terminal 34 when FET 12 is turned "on." A second source of reference potential, $V_4 = 5$ volts, is adapted to be connected to output terminal 34 when p-channel FET 24 is turned "on."

Shifting and amplifying circuit 10′ according to this embodiment of the invention exhibits certain advantages over the circuit of FIG. 1. For example, as will be explained hereinafter, this circuit operates more quickly than the circuit of FIG. 1 in that n-channel FET 12 may be turned "off" more rapidly. Additionally, this circuit is designed to operate in conjunction with less than ideal $T^2L$ bipolar circuits in that this circuit receives an input voltage, $V_{IN}$, which varies between a first predetermined magnitude, $V_1 = 0$ volts, and a second predetermined magnitude, $V_2 = 3.2$ volts, which voltages correspond, respectively, to a "0" level and a typical "1" level of a $T^2L$ bipolar circuit. This is in contrast to FIG. 1 in which the input voltages correspond to "ideal" $T^2L$ levels.

As indicated in FIG. 2, shifting and amplifying circuit 10' also includes a second p-channel enhancement-type FET 40 having respective gate, source and drain terminals, 42, 44 and 46. The gate terminal 42 of FET 40 is connected to the gate terminal 25 of second n-channel FET 22, the latter gate terminal now connected to output terminal 34 (rather than tied to the source terminal as in the previous embodiment). The source and drain terminals of FET 40 are connected, respectively, between the source terminal 26 of FET 24 and input terminal 38.

In operation, assume that $V_{IN} = V_1 = 0$ volts, then first p-channel enhancement-type FET 24 is rendered conductive or "on," first n-channel deep-depletion type FET 12 is rendered nonconductive or "off" and the second source of reference potential, $V_4 = 5$ volts, is applied to output terminal 34. Note that this output voltage corresponds to a "1" logic level utilizable in MOS and SOS MOS circuits.

When the second predetermined voltage, $V_2 = 3.2$ volts (corresponding to a "1" logic level provided by a $T^2L$ bipolar circuit) is applied to the gate terminal 28 of p-channel FET 24 (while 5 volts is applied to the source terminal of this FET), it is apparent that a 3.2 input voltage may be insufficient to fully render p-channel FET 24 nonconductive or "off." Moreover, the translated voltage at the gate of FET 12 is insufficient to turn FET 12 on heavily; hence, output node 34 would move slowly toward $V_3$. This is remedied by second p-channel enhancement-type FET 40.

Specifically, when $V_{IN} = V_2 = 3.2$ volts, p-channel FET 24 starts to turn "off," n-channel FET 12 starts to turn "on," and the voltage at output terminal 34 changes, i.e., starts to go toward $V_3 = -6$ volts. As the voltage at output terminal 34 varies (goes toward −6 volts), the gate to source voltage of p-channel FET 40 also goes negative. As the gate to source voltage of FET 40 goes negative, the threshold voltage for this FET is reached (corresponding to a gate to source voltage of about −2 volts) and FET 40 is rendered conductive or "on." When FET 40 turns "on," the 5 volt supply at terminal 32 is coupled to the input terminal 38. Accordingly, the input voltage is "pulled up" to 5 volts from 3.2 volts. This, in turn, reduces the gate to source voltage of FET 24 to zero volts and quickly turns "off" FET 24. Moreover, this greater positive voltage, translated through diode 36, provides greater "on" bias to n-channel FET 12, causing it to conduct harder. FET 40 stays on until $V_{IN}$ goes to 0 volts, i.e., until the $T^2L$ input goes to its "0" level.

Another advantage provided by the shifting and amplifying circuit of FIG. 2 is more rapid operation, as compared to the circuit of FIG. 1. Specifically, as explained hereinbefore, one disadvantage of the circuit of FIG. 1 is that n-channel deep-depletion type FET 12 is not rendered "off" as quickly as possible since the only discharge path for the gate capacitance of this FET is through deep-depletion type FET 22 and, since FET 22 conducts only residual current, it takes a while for the gate capacitance to discharge. In contrast in FIG. 2, when the input voltage goes from $V_4$ to $V_1$ and the output voltage goes from $V_3$ to $V_4$, the gate to source voltage of FET 22 starts to go positive. This, in turn, turns FET 22 "on" "hard" thereby providing a discharge path for the gate capacitance of FET 12. Accordingly, FET 12 may be turned "off" in a relatively rapid fashion. When the input voltage goes from $V_1$ to $V_4$ and the output voltage goes from $V_4$ to $V_3$, FET 22 turns off.

To summarize the operation of circuit 10', this circuit operates in much the same manner as circuit 10, (that is, provides an output of $V_4 = 5$ volts when p-channel enhancement-type FET 24 is "on" and an output of $V_3 = -6$ volts when n-channel deep-depletion type FET 12 is "on") but further operates quickly and is utilizable to operate in conjunction with input voltages which correspond to logic levels typically found in bipolar circuits. In addition, the use of second p-channel enhancement-type FET 40 provides the valuable function of input protection against static charge damage of the gates of FET 12 and FET 24 since excessive input voltage causes FET 40 to conduct either by MOS transistor action by non-destructive punch-through breakdown, depending on the input polarity.

Obviously, other modifications of the present invention are possible in light of the above teachings. Thus, the various voltages are exemplary only and, for example, a plurality of Zener diodes may be included in series in order to provide greater voltage handling capacity for the circuit. In a similar manner, although the circuits have been shown as fabricated by utilizing p-channel enhancement-type FETs and n-channel deep-depletion type FETs, n-channel enhancement-type and p-channel deep-depletion type FETs may be utilized, if so desired. Still further, only FET 22 in FIG. 1 need be of the deep-depletion type; the other FETs may be either deep-depletion or enhancement types. In FIG. 2, all FET may be either deep-depletion or enhancement types. Furthermore, although the circuits have been described as bieng particularly adaptable for providing logic levels utilizable with MOS and SOS MOS circuits, other voltage outputs may be provided, if so desired. It is also apparent that the logic levels provided at output terminal 34 are "inverted" with respect to the logic levels provided at input terminal 38. Thus, when the input terminal receives a voltage corresponding to a logic "0" state, the output of the circuit provides a voltage corresponding to a logic "1" state and vice versa. Accordingly, if direct translation between logic levels is desired, appropriate circuitry coupled to the output of the circuits may be utilized.

What is claimed is:

1. A shifting and amplifying circuit comprising an input terminal adapted to be connected to a source of input potential, said input potential adapted to vary at least between a first predetermined input voltage and a second predetermined input voltage, an output terminal, a first enhancement-type semiconductive circuit element, a first deep-depletion type semiconductive circuit element, a first terminal connected to said first deep-depletion type semiconductive circuit element for connecting a first source of reference potential to said first deep-depletion type semiconductive circuit element, a second terminal connected to said first enhancement-type semiconductive circuit element for connecting a second source of reference potential to said first enhancement-type semiconductive circuit element, means for connecting said input potential to said first enhancement-type semiconductive circuit element for rendering said first enhancement-type semiconductive circuit element conductive when said input potential is at said first predetermined input voltage thereby connecting said second source of reference potential to said output terminal, means for connecting said input potential to said first deep-depletion type semiconductive circuit element for rendering said first deep-depletion type semiconductive circuit element conductive when said input potential is at said second predetermined input voltage thereby connecting said first source of reference potential to said output terminal, said means for connecting said input potential to said first deep-depletion type semiconductive circuit element including an additional source of voltage adapted to be added to said input potential.

2. The invention according to claim 1 wherein said additional source of voltage is provided by a breakdown device connected between said input terminal and said first deep-depletion type semiconductive circuit element.

3. The invention according to claim 2 further comprising means for controlling said breakdown device.

4. The invention according to claim 3 wherein said breakdown device is a Zener diode having a predetermined breakdown voltage and said means for controlling said breakdown device is a current source for maintaining said Zener diode at its breakdown voltage.

5. The invention according to claim 4 wherein said current source is a second deep-depletion type semiconductive circuit element.

6. The invention according to claim 1 further comprising means for pulling up said input potential to a third predetermined input voltage for controlling conduction of said first enhancement-type semiconductive circuit element.

7. The invention according to claim 6 wherein said pull up means is a second enhancement-type semiconductive circuit element connected between said input terminal and said first enhancement-type semiconductive circuit element.

8. The invention according to claim 7 wherein said second enhancement-type semiconductive circuit element is adapted to connect said second source of reference potential to said input terminal.

9. The invention according to claim 1 further comprising means for providing a discharge path for said first deep-depletion type semiconductive circuit element when said first enhancement-type semiconductive circuit element is rendered conductive to render said first deep-depletion type semiconductive circuit element nonconductive.

10. The invention according to claim 9 wherein said means for providing a discharge path is a second deep-depletion type semiconductive circuit element.

11. A shifting and amplifying circuit comprising an input terminal, an output terminal, an enhancement-type semiconductive circuit element having first, second and third terminals, the second terminal of said enhancement-type semiconductive element coupled to said input terminal, a first deep-depletion type semiconductive circuit element having first, second and third terminals, the third terminals of the enhancement-type semiconductive circuit element and the deep-depletion type semiconductive circuit element coupled to said output terminal, a Zener diode having a predetermined breakdown voltage coupled between the second terminals of said enhancement-type semiconductive circuit element and said first deep-depletion type semiconductive circuit element, a second deep-depletion type semiconductive circuit element coupled between the first and second terminals of said first deep-depletion type semiconductive circuit element for controlling the current to said Zener diode, means for applying an input potential to said input terminal, said input potential adapted to vary between a first predetermined voltage and a second predetermined voltage, means for applying first and second reference potentials to the first terminals respectively of said enhancement-type semiconductive circuit element and said first deep-depletion type semiconductive circuit element, the application of said first predetermined input voltage rendering said enhancement-type semiconductive circuit element conductive and said first deep-depletion type semiconductive circuit element nonconductive thereby connecting said first source of reference potential to said output terminal and application of said second predetermined input voltage rendering said first deep-depletion type semiconductive circuit element conductive and said enhancement-type semiconductive circuit element nonconductive thereby connecting said second source of reference potential to said output terminal, said Zenor diode translating the voltage applied at said input terminal to appropriate levels to control the conduction and nonconduction of said first deep-depletion type semiconductive circuit element.

12. The invention according to claim 11 wherein said second deep-depletion type semiconductive circuit element provides a residual drain current in order to keep said Zener diode at its breakdown voltage.

13. The invention according to claim 12 wherein said second source of reference potential is substantially equal to the breakdown voltage of said Zener diode.

14. A shifting and amplifying circuit comprising an input terminal, an output terminal, an enhancement-type FET having source, gate and drain electrodes, the gate electrode of said enhancement-type FET being coupled to said input terminal, a first deep-depletion type FET having source, gate and drain electrodes, the drain electrodes of said enhancement-type FET and deep-depletion type FET coupled to said output terminal, means for providing an additional source of voltage coupled between the gate electrodes of said enhancement-type FET and said first deep-depletion type FET, means for controlling said additional source of voltage coupled between the source and gate electrodes of said first deep-depletion type FET, means for applying an input potential to said input terminal adapted to vary between a first predetermined voltage and a second predetermined voltage, means for applying first and second reference potentials to the source electrodes respectively of said enhancement-type FET and deep-depletion type FET, said first predetermined input voltage being coupled to said enhancement-type FET to render said enhancement-type FET conductive thereby connecting said first source of reference potential to said output terminal, said second predetermined input voltage and said additional source of voltage coupled to said first deep-depletion type FET to render said first deep-depletion type FET conductive, thereby connecting said second source of reference potential to said output terminal.

15. The invention according to claim 14 wherein said source of additional voltage is provided by a breakdown device having a predetermined breakdown voltage and said means for controlling said source of additional voltage is a current source for maintaining said breakdown device at its breakdown voltage.

16. The invention according to claim 15 wherein said breakdown device is a Zener diode and said means for controlling said breakdown device is a second deep-depletion type FET for applying a residual drain current to said Zener diode.

17. The invention according to claim 16 wherein said first source of reference potential is substantially equal to the breakdown voltage of said Zener diode.

18. A shifting and amplifying circuit comprising an input terminal, an output terminal, first and second deep-depletion type FETS having source, gate and drain electrodes, the source electrodes being coupled together and the gate electrode of said first deep-depletion type FET coupled to the drain electrode of the second deep-depletion type FET, the gate electrode of said second deep-depletion type FET and the drain electrode of said first deep-depletion type FET being coupled to the output terminal, first and second enhancement-type FETS having source, gate and drain electrodes, said source electrodes being coupled together, the gate electrode of the second enhancement-type FET being coupled to the gate electrode of the second deep-depletion type FET, the gate electrode of said first enhancement-type FET and the drain electrode of said second enhancement-type FET coupled to the input terminal, the drain electrode of said first enhancement-type FET being coupled to the output terminal, a Zener diode having a predetermined breakdown voltage coupled between the drain electrode of said second deep-depletion type FET and the drain electrode of said second enhancement-type FET, means for applying an input potential to said input terminal adapted to vary between a first predetermined voltage and a second predetermined voltage, means for applying first and second reference potentials to the source electrodes respectively of the enhancement-type FETS and deep-depletion type FETS, said first enhancement-type FET connecting said first source of reference potential to said input terminal thereby rendering said second enhancement-type FET nonconductive as said input potential varies between said first predetermined input voltage and said second predetermined input voltage, said second enhancement-type FET being rendered conductive when said source of input potential is at said first predetermined input voltage thereby connecting said first source of reference potential to said output terminal, said Zener diode providing a voltage to the gate electrode of said first deep-depletion type FET substantially equal to the sum of said input voltage and the breakdown voltage thereby rendering said first deep-depletion type FET conductive when said source of input potential is at said second predetermined input voltage thereby connecting said second source of reference potential to said output terminal, said second deep-depletion type FET providing a discharge path for said first deep-depletion type FET thereby rapidly rendering said first deep-depletion type FET nonconductive when said input terminal is at said first predetermined input voltage.

* * * * *